(12) United States Patent
Takada et al.

(10) Patent No.: US 7,482,292 B2
(45) Date of Patent: *Jan. 27, 2009

(54) COMPOSITION FOR CERAMIC SUBSTRATE, CERAMIC SUBSTRATE, METHOD FOR PRODUCING CERAMIC SUBSTRATE

(75) Inventors: Takahiro Takada, Shiga-Ken (JP); Hirofumi Yamamoto, Hyogo-Ken (JP); Keisuke Kageyama, Osaka-Fu (JP)

(73) Assignee: Murata Manufacturing Co., Ltd (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/955,068

(22) Filed: Dec. 12, 2007

(65) Prior Publication Data

US 2008/0119345 A1 May 22, 2008

Related U.S. Application Data

(62) Division of application No. 10/559,105, filed as application No. PCT/JP2004/012651 on Sep. 1, 2004, now Pat. No. 7,396,785.

(30) Foreign Application Priority Data

Jan. 30, 2004 (JP) ............................. 2004-024099

(51) Int. Cl.
*C03C 10/02* (2006.01)
*C03C 3/15* (2006.01)
*H01B 3/12* (2006.01)

(52) U.S. Cl. .......................... 501/10; 501/32; 501/50; 428/210; 428/434

(58) Field of Classification Search ................... 501/10, 501/32, 50; 428/434, 210
See application file for complete search history.

(56) References Cited

U.S. PATENT DOCUMENTS

| 3,958,999 | A | 5/1976 | Izumitani |
| 4,144,076 | A | 3/1979 | Matsumanu |
| 5,674,789 | A | 10/1997 | Anquetil |
| 6,121,173 | A | 9/2000 | Terashi |
| 6,147,019 | A | 11/2000 | Donahue |
| 6,844,279 | B2 | 1/2005 | Hayashi |

FOREIGN PATENT DOCUMENTS

| JP | 03-53269 | 8/1991 |
| JP | 07-135379 | 5/1995 |

(Continued)

OTHER PUBLICATIONS

Written Opinion of the International Searching Authority dated Nov. 22, 2004.

(Continued)

*Primary Examiner*—Karl E Group
(74) *Attorney, Agent, or Firm*—Dickstein, Shapiro, LLP.

(57) ABSTRACT

A ceramic substrate composition is provided which can be co-fired with a low-melting metal and exhibits excellent dielectric characteristics at high frequencies, particularly tens of gigahertz. The ceramic substrate composition mainly contains a glass represented by $aB_2O_3\text{-}bRe_2O_3\text{-}cZnO$, wherein the molar ratios (a, b, and c) fall within a region defined in a ternary composition diagram by Point A (0.4, 0.595, 0.005), Point B (0.4, 0.25, 0.35), Point C (0.52, 0.01, 0.47), Point D (0.9, 0.005, 0.095), and Point E (0.9, 0.09, 0.01).

6 Claims, 4 Drawing Sheets

FOREIGN PATENT DOCUMENTS

| | | |
|---|---|---|
| JP | 07-187705 | 7/1995 |
| JP | 10-330161 | 12/1998 |

OTHER PUBLICATIONS

Takahiro Takada, Hirofumi Yamamoto, Keisuke Kageyama "Synthesis and Microwave Dielectric Properties of $x\text{Re}_2\text{O}_3\text{-}y\text{B}_2\text{O}_3$ (Re = La, Nd, Sm, Dy, Jo and Y) Compounds" Jpn. J. Appl. Phys. vol. 42 No. 9B, (Sep. 2003) pp. 6162-6167.

Takahiro Takada, Keisuke Kageyama "Synthesis and Microwave Dielectrict Properties of$\text{La}_2\text{O}_3\text{-}x\text{B}_2\text{O}_3$-Based Melt Mixtures for Low- Temperature Cofired Ceramics" Jpn. J. Appl. Phys. vol. 44 No. 9A, (2005) pp. 6629-6635.

COMPOSITION FOR CERAMIC SUBSTRATE, CERAMIC SUBSTRATE, METHOD FOR PRODUCING CERAMIC SUBSTRATE

This is a division of application Ser. No. 10/559,105, filed Dec. 6, 2005, now U.S. Pat. No. 7,396,785 which was a national phase application for PCT/JP2004/012651, filed Sep. 1, 2004.

TECHNICAL FIELD

The present invention relates to glass-containing ceramic substrate compositions, ceramic substrates prepared with the compositions, and methods for producing the ceramic substrates.

BACKGROUND ART

In recent years, information processors, typified by computers and mobile communication systems, have dramatically achieved higher information processing speeds, size reductions, and a larger number of functions. Such improvements in the performance of information processors have been realized mainly with increasing packing densities, speeds, and performance of semiconductor devices.

Semiconductor devices are conventionally mounted on alumina insulating substrates, which are fired at 1,500° C. to 1,600° C. Accordingly, high-melting metals such as Mo, Mo—Ni, and W must be used as the material for patterned conductors to co-fire the insulating substrates with the patterned conductors. Such high-melting metals, however, have high resistivity and thus pose difficulty in sufficiently exploiting the performance of semiconductor devices for higher information processing speeds and higher processing signal frequencies.

A variety of ceramic substrate compositions have been developed which can be co-fired with low-melting metals having low resistivity, such as Ag and Cu. An example is a ceramic substrate composition prepared by adding $Al_2O_3$ to a $CaO$—$SiO_2$—$Al_2O_3$—$B_2O_3$-based glass (see Patent Document 1).

Patent Document 1: Japanese Examined Patent Application Publication No. 3-53269

DISCLOSURE OF INVENTION

Problems to be Solved by the Invention

The ceramic substrate composition disclosed in Patent Document 1 can be fired at 800° C. to 1,000° C. Use of the ceramic substrate composition allows the production of a ceramic substrate including internal patterned conductors made of a low-melting metal such as Ag or Cu.

The ceramic substrate produced by firing the ceramic substrate composition, however, has high dielectric loss and particularly, cannot be used for the GHz range. Although the ceramic substrate can be used together with patterned conductors made of metals with low resistivity, such as Ag and Cu, the high dielectric loss makes it difficult to increase the processing speeds and processing signal frequencies of information processors using the ceramic substrate.

An object of the present invention, which has been created under the above circumstances, is to provide a ceramic substrate composition that can be co-fired with a low-melting metal and exhibits excellent characteristics at high frequencies, e.g., in the GHz range, and also provide a ceramic substrate prepared with the ceramic substrate composition and a method for producing the ceramic substrate.

Means for Solving the Problems

The present invention provides a ceramic substrate composition containing a glass composition represented by $aB_2O_3$-$bRe_2O_3$-$cZnO$ (wherein Re is a rare earth element; and $a+b+c=1$). The molar amounts (a, b, and c) fall within a region defined in a ternary composition diagram by Point A (0.4, 0.595, 0.005), Point B (0.4, 0.25, 0.35), Point C (0.52, 0.01, 0.47), Point D (0.9, 0.005, 0.095), and Point E (0.9, 0.09, 0.01).

The present invention further provides a ceramic substrate including $ReBO_3$ and/or $ReB_3O_6$ precipitated as a main crystal phase. The ceramic substrate is produced by forming the above ceramic substrate composition according to the present invention into a predetermined shape and firing the shaped product.

The present invention further provides a method for producing a ceramic substrate. This method includes forming the above ceramic substrate composition according to the present invention into a predetermined shape and firing the shaped product.

Advantages

The ceramic substrate composition according to the present invention contains the glass represented by $aB_2O_3$-$bRe_2O_3$-$cZnO$ (wherein Re is a rare earth element; and $a+b+c=1$). The molar amounts (a, b, and c) fall within the region defined in the ternary composition diagram by Point A (0.4, 0.595, 0.005), Point B (0.4, 0.25, 0.35), Point C (0.52, 0.01, 0.47), Point D (0.9, 0.005, 0.095), and Point E (0.9, 0.09, 0.01). This ceramic substrate composition can be co-fired with a low-melting metal such as silver or copper, and can be used to provide a ceramic substrate having excellent characteristics at high frequencies, e.g., in the GHz range.

REFERENCE NUMERALS

Figure 1:
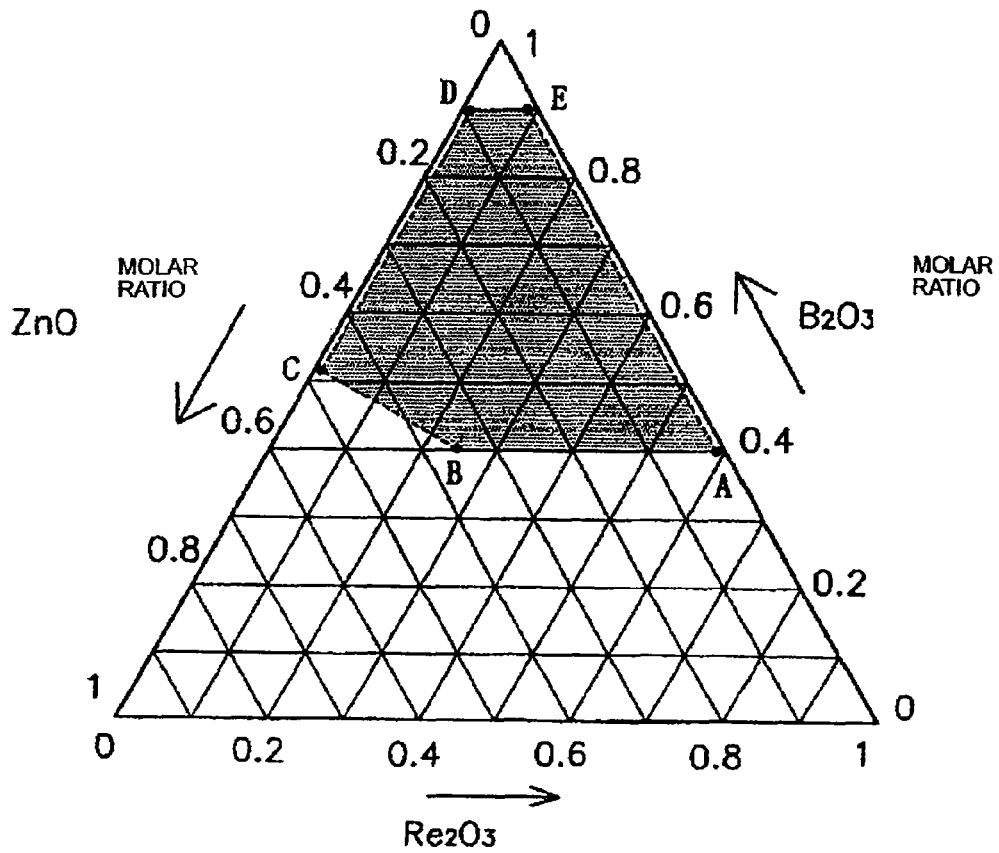
FIG. 1 is a ternary composition diagram showing the composition range of a glass represented by the general formula A.

1 ceramic substrate
2 ceramic laminate
2a, 2b, 2c, 2d, and 2e ceramic layer
5 internal line conductor
6 via hole conductor
7 and 8 external electrode
9a and 9b surface-mount component

BEST MODE FOR CARRYING OUT THE INVENTION

A ceramic substrate composition according to the present invention will now be described.

The ceramic substrate composition according to the present invention contains a glass composition represented by the following general formula A:

$$aB_2O_3\text{-}bRe_2O_3\text{-}cZnO$$

(wherein Re is a rare earth element; and $a+b+c=1$). In a ternary composition diagram shown in FIG. 1, the molar amounts (a, b, and c) in the above general formula A fall within a region defined by:

Point A (0.4, 0.595, 0.005),
Point B (0.4, 0.25, 0.35),
Point C (0.52, 0.01, 0.47),
Point D (0.9, 0.005, 0.095), and
Point E (0.9, 0.09, 0.01)

(the above region includes molar ratios on the lines between Points A, B, C, D, and E).

This glass is produced by melting and rapidly cooling a raw material including a compound (preferably, an oxide) containing boron, a compound (preferably, an oxide) containing a rare earth element, and a compound (preferably, an oxide) containing zinc. The glass may be completely amorphous or partially crystallized. Crystal phases (crystal compounds) such as $ReBO_3$, $Re_3BO_6$, and $ReB_3O_6$ (wherein Re is a rare earth element) can be precipitated after the firing of the glass by optimally selecting the composition of the glass represented by the general formula A and the compositions and amounts of additives added to the glass. A ceramic substrate produced with the ceramic substrate composition exhibits extremely low dielectric loss, e.g., an fQ of 25,000 GHz or more (that is, a Q of 2,500 or more at 10 GHz), excellent stability to temperature, e.g., a rate of change in resonance frequency with respect to change in temperature within ±50 ppm/° C., and high strength, e.g., a flexural strength of 150 MPa or more.

In the glass represented by the general formula A, $B_2O_3$ functions as an oxide that forms the network of the glass or a component of possible crystal phases. For the ceramic substrate composition according to the present invention, boron is contained in the glass, which is prepared by melting and rapid cooling; therefore, boron oxide, which is generally known to have low resistance to humidity, can be subjected to the reaction by firing at low temperature. In addition, the firing temperature for the ceramic substrate composition and the resistivity of the sintered ceramic product (ceramic substrate) vary depending on the type of rare earth element contained in the glass. The firing temperature and the resistivity can therefore be optionally controlled using a desired combination of elements. Furthermore, the addition of ZnO allows stable production of the glass and the maintenance of low dielectric loss.

If the content of $B_2O_3$ exceeds a molar ratio of 0.9 in the composition region shown in FIG. 1, $B_2O_3$ that does not contribute to the precipitation of an $ReBO_3$—ZnO crystal phase partially liquefies and causes high dielectric loss at high frequencies. If, on the other hand, the content of $B_2O_3$ falls below a molar ratio of 0.4, the glass cannot be stably prepared, and thus the resultant ceramic substrate exhibits high dielectric loss. If the content of $Re_2O_3$ exceeds a molar ratio of 0.595, the ceramic substrate composition has difficulty in being fired at a temperature at which a low-melting metal such as Ag or Cu can be co-fired. If, on the other hand, the content of $Re_2O_3$ falls below a molar ratio of 0.005, crystal compounds are difficult to precipitate, and thus the ceramic substrate composition has difficulty in providing a ceramic substrate having low dielectric loss at high frequencies. If the content of ZnO exceeds a molar ratio of 0.47, the resultant ceramic substrate exhibits high dielectric loss at high frequencies. If, on the other hand, the content of ZnO falls below a molar ratio of 0.005, the glass cannot be stably prepared, and thus the resultant ceramic substrate exhibits high dielectric loss.

Various rare earth elements, particularly lanthanoids, may be used as the rare earth element (Re) contained in the glass composition represented by the general formula A. Examples of the rare earth element used include lanthanum (La), neodymium (Nd), cerium (Ce), samarium (Sm), and terbium (Tb); among them, at least one rare earth element selected from the group consisting of lanthanum and neodymium is preferably used. The ionic radius of the Re (rare earth element) contained in $ReBO_3$ is relatively large; $ReBO_3$ very probably precipitates from the glass represented by the general formula A. Lanthanum and neodymium are preferably used because they have an orthorhombic crystal structure and allow the production of a dense sintered ceramic material with a low firing temperature at which a low-melting metal such as Ag or Cu can be co-fired. These rare earth elements can also reduce the dielectric loss at high frequencies.

The ceramic substrate composition according to the present invention preferably further contains at least one oxide selected from the group consisting of aluminum oxide ($Al_2O_3$) and titanium oxide ($TiO_2$) in an amount of 50% or less by weight of the total amount of the ceramic substrate composition. The oxide, such as $Al_2O_3$ and $TiO_2$, is preferably contained as a ceramic additive, though the oxide may also be contained in the raw material for preparation of the glass represented by the general formula A. Such a specific content of the oxide in the ceramic substrate composition can improve the strength of the resultant ceramic substrate. If, particularly, aluminum oxide is mainly contained, the resultant ceramic substrate exhibits a resistivity of about 7 to 10. If, on the other hand, titanium oxide is mainly contained, the resistivity of the ceramic substrate can be increased to about 16. If the content of the oxide exceeds 50% by weight of the total amount of the ceramic substrate composition, the firing temperature for the ceramic substrate must be increased, and thus the ceramic substrate tends to have difficulty in being fired at 1,000° C. or less.

The ceramic substrate composition according to the present invention may further contain a mixed oxide ceramic material including at least one crystal phase selected from the group consisting of $ReBO_3$, $Re_3BO_6$, and $ReB_3O_6$ (wherein Re is a rare earth element). That is, the mixed oxide ceramic material, which mainly includes $ReBO_3$, $Re_3BO_6$, or $ReB_3O_6$, may be added to the glass represented by the general formula A as an additive to produce a ceramic substrate having excellent dielectric characteristics at high frequencies with a low firing temperature. The mixed oxide ceramic material can be prepared by calcining a raw material including a compound (preferably, an oxide) containing a rare earth element and a compound (preferably, an oxide) containing boron at about 800° C. to 1,300° C.

The mixed oxide ceramic material is preferably produced by calcining a raw material represented by $dB_2O_3\text{-}eRe_2O_3$ (wherein Re is a rare earth element; and $d/e=1/3$ to $3/1$). This range of composition provides a ceramic substrate having low dielectric loss at high frequencies without significant deterioration of the characteristics of the glass. If the molar ratio d/e falls below 1/3, the ceramic substrate composition tends to have difficulty in being fired at a temperature at which a low-melting metal such as Ag or Cu can be co-fired. If, on the other hand, the molar ratio d/e exceeds 3/1, the ceramic substrate composition may fail to provide a ceramic substrate having a desired shape. The amount of $B_2O_3$ and $Re_2O_3$ added is preferably determined such that the total composition of the resultant ceramic substrate falls within the region in the ternary composition diagram shown in FIG. 1.

The mixed oxide ceramic material represented by $dB_2O_3$-$eRe_2O_3$ preferably further contains ZnO. The ZnO contained in the mixed oxide ceramic material can lower the firing temperature for the ceramic substrate composition without significant deterioration of the characteristics of the resultant ceramic substrate. The content of ZnO in the mixed oxide ceramic material is not particularly limited; preferably, the content is determined such that the total composition of the resultant ceramic substrate falls within the region in the ternary composition diagram shown in FIG. 1.

The content of the mixed oxide ceramic material in the ceramic substrate composition is preferably 20% to 90% by weight of the total amount of the glass represented by the general formula A and the mixed oxide ceramic material. If the content falls below 20% by weight of the total amount of the glass and the mixed oxide ceramic material, the glass may melt during the firing of the ceramic substrate composition and fail to provide a ceramic substrate having a desired shape. If, on the other hand, the content exceeds 90% by weight of the total amount of the glass and the mixed oxide ceramic material, the ceramic substrate composition tends to have difficulty in being fired at a temperature at which a low-melting metal such as Ag or Cu can be co-fired.

The ceramic substrate composition according to the present invention may further contain a crystallization glass that can precipitate at least one crystal phase selected from the group consisting of $ReBO_3$, $Re_3BO_6$, and $ReB_3O_6$ (wherein Re is a rare earth element). That is, the crystallization glass, which can precipitate the above mixed oxide crystal phases, may be added to the glass represented by the general formula A as an additive to lower the firing temperature for the ceramic substrate composition while maintaining the characteristics of the resultant ceramic substrate. In particular, an $ReBO_3$—ZnO crystal phase may melt at 850° C. to 900° C. when the ceramic substrate composition contains a large amount of glass represented by the general formula A or depending on the composition and amount of mixed oxide ceramic material added to the glass. In that case, the addition of the crystallization glass allows stable production of a ceramic substrate having low porosity and low dielectric loss at high frequencies. The crystallization glass, which is prepared by melting and rapidly cooling a raw material, refers to a "glass partially including a crystal phase" or a "glass having the ability to precipitate a crystal phase in firing."

Preferably, the crystallization glass is represented by $gB_2O_3$-$hRe_2O_3$-$iZnO$ (wherein Re is a rare earth element; and g+h+i=1) and the molar amounts (g, h, and i) fall within a region defined in a ternary composition diagram by Point F (0.4, 0.595, 0.005), Point G (0.4, 0.25, 0.35), Point H (0.52, 0.01, 0.47), Point I (0.9, 0.005, 0.095), and Point J (0.9, 0.09, 0.01). This region covers the same composition range as that of the glass represented by the general formula A. If the crystallization glass has such a composition, the ceramic substrate composition can be fired at a temperature at which a low-melting metal such as Ag or Cu can be co-fired. The ceramic substrate composition therefore allows stable production of a ceramic substrate having low dielectric loss at high frequencies, e.g., several to tens of gigahertz. The composition of the crystallization glass is particularly preferably selected such that the total composition of the resultant ceramic substrate falls within the region in the ternary composition diagram shown in FIG. 1.

The content of the crystallization glass is preferably 20% to 90% by weight of the total amount of the glass represented by the general formula A and the crystallization glass. If the content of the crystallization glass falls below 20% by weight of the total amount of the glass represented by the general formula A and the mixed oxide ceramic material, the glass may melt during the firing of the ceramic substrate composition and fail to provide a ceramic substrate having a desired shape. If, on the other hand, the content of the crystallization glass exceeds 90% by weight of the total amount of the glass represented by the general formula A and the crystallization glass, the ceramic substrate composition tends to have difficulty in being fired at a temperature at which a low-melting metal such as Ag or Cu can be co-fired.

The ceramic substrate composition according to the present invention may further contain a rare earth oxide represented by $Re_2O_3$ (wherein Re is a rare earth element). In particular, when a ceramic substrate composition containing a large absolute amount of $B_2O_3$ is co-fired with Ag, the ceramic substrate composition may readily react with Ag. Addition of $Re_2O_3$, however, allows stable production of a ceramic substrate having low dielectric loss at high frequencies. The rare earth element contained is preferably at least one element selected from the group consisting of lanthanum and neodymium.

Next, a ceramic substrate according to the present invention is described below with reference to FIG. 2.

A ceramic substrate 1 includes a ceramic laminate 2 having a multilayer structure of ceramic layers 2a, 2b, 2c, 2d, and 2e made of the ceramic substrate composition according to the present invention.

The ceramic laminate 2 has internal patterned conductors and external patterned conductors formed on the ceramic layers 2a, 2b, 2c, 2d, and 2e. The internal patterned conductors include internal line conductors 5 formed on the interfaces between the ceramic layers 2 and via hole conductors 6 penetrating the ceramic layers. The external patterned conductors include external electrodes 8 formed on a main surface 3 of the ceramic laminate 2 and external electrodes 7 formed on the other main surface 4 of the ceramic laminate 2. The external electrodes 7 are used as land electrodes for connecting the ceramic substrate 1 to a mother board (not shown). The external electrodes 8 are used for connection to surface-mount components 9a and 9b mounted on the surface of the ceramic laminate 2. The surface-mount component 9a is, for example, a monolithic ceramic capacitor chip having planar terminal electrodes, and the surface-mount component 9b is, for example, a semiconductor device having bump electrodes.

The patterned conductors mainly contain at least one metal selected from the group consisting of Ag and Cu. Low-melting metals such as Ag and Cu are particularly preferred because they have lower resistivity than high-melting metals such as tungsten and molybdenum and exhibit excellent electrical conductivity at high frequencies.

The glass matrix of the ceramic substrate precipitates at least one mixed oxide crystal phase (namely, a crystal phase of a mixed oxide containing a rare earth element and boron) selected from the group consisting of $ReBO_3$, $ReB_3O_6$ (or $Re(B_2O_3)_3$), and $Re_3BO_6$. If the raw material contains $Al_2O_3$, the glass matrix can further precipitate crystal phases such as $ReAl_3(BO_3)O_4$, $ReAl_3(BO_3)_4$, and $Al_2O_3$. If, on the other hand, the raw material contains $TiO_2$, the glass matrix can further precipitate crystal phases such as $TiO_2$. Such crystal phases contribute significantly to, for example, the reduction in dielectric loss at high frequencies, the improvement in the strength of the sintered laminate, and the control of relative dielectric constant.

Figure 2:
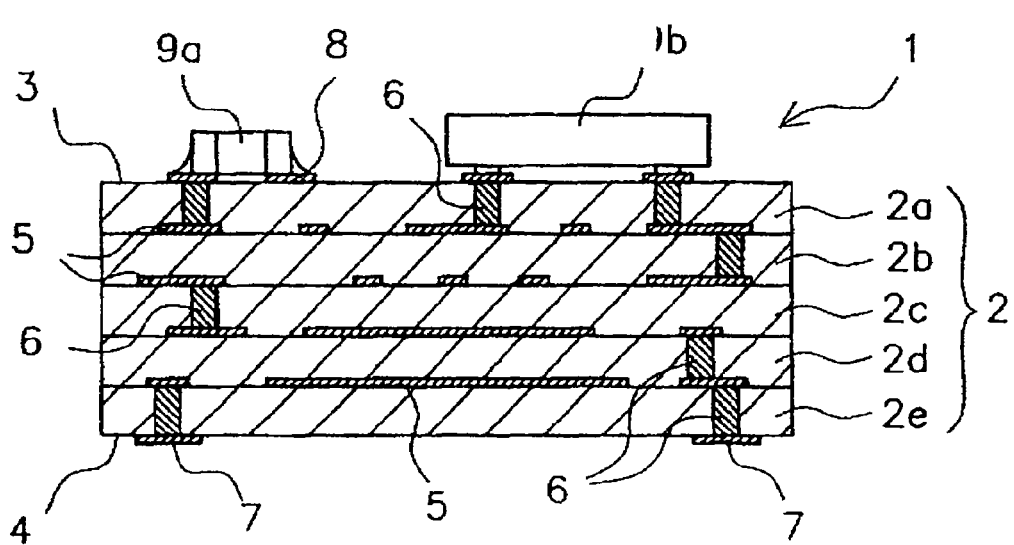
FIG. 2 is a schematic sectional view of a ceramic substrate according to an embodiment of the present invention.

Next, a method for producing the ceramic substrate 1 shown in FIG. 2 is described below with reference to FIG. 3.

Figure 3:
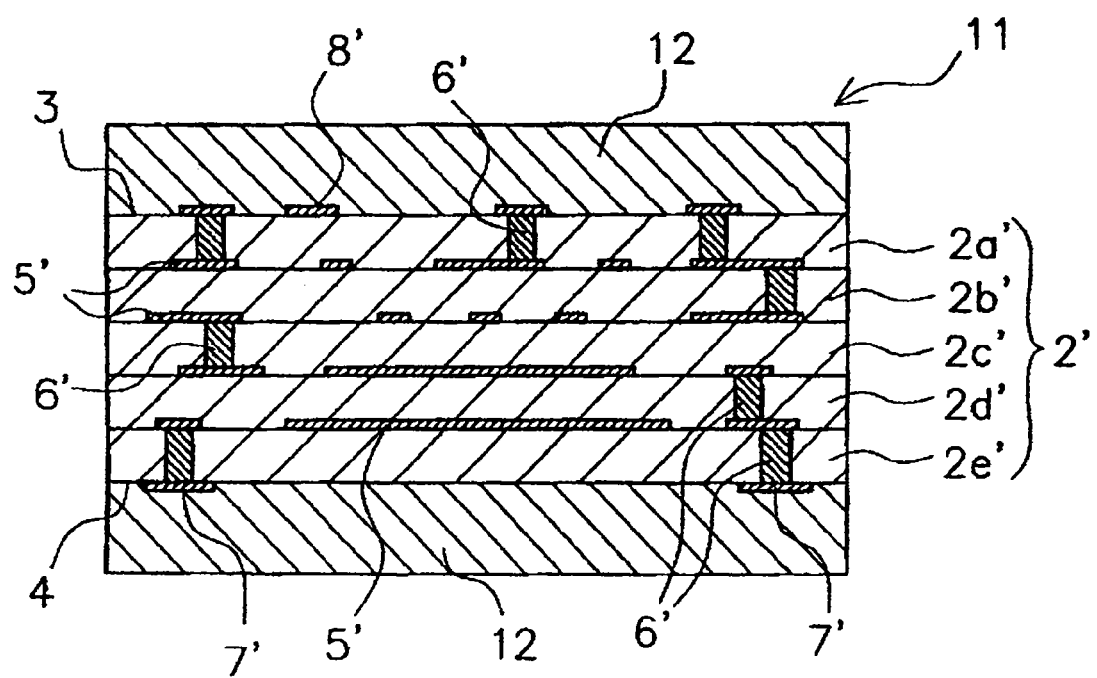
FIG. 3 is a schematic sectional view illustrating a step of a process for producing a ceramic substrate shown in FIG. 2.

The ceramic laminate 2 included in the ceramic substrate 1 shown in FIG. 2 is prepared by firing a composite laminate 11 shown in FIG. 3.

The composite laminate 11 includes an unfired ceramic laminate 2' prepared by laminating ceramic green sheets 2a', 2b', 2c', 2d', and 2e' corresponding to the ceramic layers 2a, 2b, 2c, 2d, and 2e, respectively, and constraining layers 12 provided on the main surfaces 3 and 4 of the unfired ceramic laminate 2'. That is, the unfired ceramic laminate 2' is a laminate of unfired ceramic layers (ceramic green sheets) made of the ceramic substrate composition according to the present invention. The constraining layers 12 contain a ceramic material that does not sinter at the sintering temperature of the ceramic substrate composition according to the present invention. The ceramic material used may be, for example, alumina powder.

In addition, various patterned conductors are provided on the ceramic green sheets of the unfired ceramic laminate 2'. The patterned conductors include unfired internal line conductors 5' that are fired to form the internal line conductors 5, unfired via hole conductors 6' that are fired to form the via hole conductors 6, and unfired external electrodes 7 and 8 that are fired to form the external electrodes 7 and 8, respectively.

The unfired composite laminate 11 is prepared by, for example, the following process.

Appropriate amounts of additives are added to a powder of a glass represented by the general formula A. The resultant mixed powder is mixed with 10% to 50% by weight of a binder such as a butyral binder or an acrylic binder and, optionally, appropriate amounts of a plasticizer such as phthalic acid and an organic solvent such as isopropyl alcohol or toluene to prepare a ceramic slurry for preparation of the ceramic green sheets 2a', 2b', 2c', 2d', and 2e'. This slurry is formed into sheets with, for example, a doctor blade to prepare ceramic green sheets. These ceramic green sheets are optionally perforated to form via holes in which the via hole conductors 6 are formed. These via holes are filled with a Ag- or Cu-based conductive paste or powder to form the unfired via hole conductors 6'. In addition, the unfired external electrodes 7' and 8' and the unfired internal line conductors 5' are optionally formed on the ceramic green sheets by screen printing with a Ag- or Cu-based conductive paste or powder. The ceramic green sheets thus formed are laminated in a predetermined order to prepare the unfired ceramic laminate 2'.

On the other hand, a ceramic powder, such as alumina powder, is mixed with appropriate amounts of a binder, a dispersant, a plasticizer, and an organic solvent as described above to prepare a ceramic slurry for preparation of ceramic green sheets for the constraining layers 12. This slurry is formed into sheets with, for example, a doctor blade to prepare ceramic green sheets for the constraining layers 12.

A predetermined number of the ceramic green sheets for the constraining layers 12 are laminated on the top and bottom of the unfired ceramic laminate 2', which is, for example, pressed at 30 to 100 kgf/cm$^2$ after preheating at 50° C. to 100° C. to prepare the composite laminate 11. As shown in FIG. 3, the composite laminate 11 includes the unfired ceramic laminate 2', and the constraining layers 12 are bonded to the main surfaces thereof. The composite laminate 11 may optionally be cut to an appropriate size. The ceramic green sheets for the constraining layers 12, which are bonded to the top and bottom main surfaces of the unfired ceramic laminate 2', may also be bonded to either the main surface 3 or the main surface 4.

The composite laminate 11 is then fired at 1,000° C. or less, particularly about 800° C. to 1,000° C. The firing process is carried out in an oxidizing atmosphere, such as air, for Ag-based patterned conductors and in a reducing atmosphere, such as N$_2$, for Cu-based patterned conductors. The composite laminate 11 may be fired with a predetermined pressure being applied thereto in the vertical direction or with no pressure being applied.

In the firing step, the constraining layers 12 themselves do not substantially sinter or shrink; therefore, they exert a constraint force on the ceramic laminate 2' to constrain the shrinkage thereof in a plane during the firing. As the ceramic substrate composition contained in the ceramic laminate 2 sinters, the ceramic laminate 2 shrinks substantially only across the thickness with the shrinkage in the plane being constrained. After the constraining layers are removed by, for example, wet blasting or brushing, a ceramic substrate having excellent surface flatness and dimensional accuracy in the plane can be provided. Subsequently, surface-mount components such as passive components, e.g., monolithic ceramic capacitor chips, and active components, e.g., semiconductor devices, are optionally mounted on the ceramic substrate to produce the ceramic substrate 1 shown in FIG. 2.

It is generally required in a process using constraining layers as described above that the constraining layers do not react with a ceramic substrate composition during the firing and can readily be removed after the firing. The ceramic substrate composition according to the present invention can be fired in the above process because the composition does not substantially react with the constraining layers, for example alumina layers. The ceramic substrate provided after the firing therefore has excellent dimensional accuracy, namely a shrinkage of 0.05% or less in the X and Y directions.

The ceramic substrate and the method for producing the ceramic substrate according to an embodiment of the present invention have been described, though ceramic substrates and methods for producing the ceramic substrates according to the present invention are not limited to the above embodiment. The present invention may be applied to, for example, a functional substrate that has various surface-mount components mounted on a main surface thereof, as described above, and that incorporates an inductor, a capacitor, or a resistor. The present invention may also be applied to, for example, a substrate for a single-function component with no surface-mount components mounted thereon.

In addition, the ceramic substrate composition according to the present invention may be applied not only to the above process using constraining layers, but also to normal processes, that is, processes without constraining layers.

The ceramic substrate according to the present invention, which has less dielectric loss at high frequencies and excellent high-frequency characteristics, is suitable for, for example, electronic components designed for microwaves and millimeter waves, including car phones, radio equipment for business and domestic uses, and cell phones.

EXAMPLES

The present invention is described with specific examples below.

(Examination of Crystallization by Firing)

Figure 4:
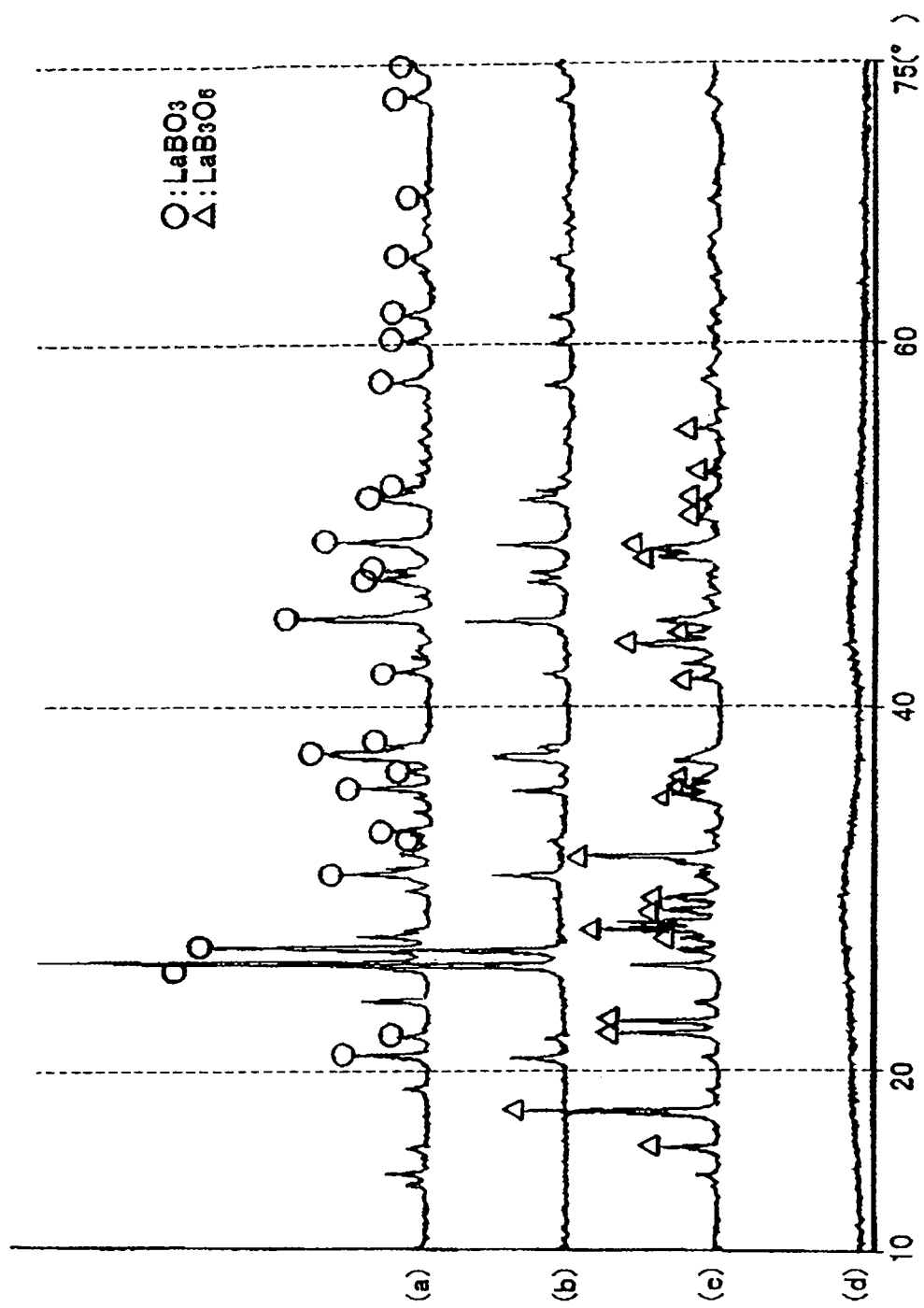
FIG. 4 is a graph showing measurements by XRD before and after the firing of glass compositions according to the present invention.

Glass compositions according to the present invention were examined for crystallization by firing. FIG. 4 shows measurements by XRD before and after the firing of glasses A and B. The glass A is an amorphous glass containing $B_2O_3$, $La_2O_3$, and ZnO at a ratio of 3.0:1.0:0.5=0.67:0.22:0.11 (in terms of molar ratio). In FIG. 4, line (d) indicates the identification data of the glass A before firing, and line (c) indicates the data after firing in air at 900° C. for two hours. The results in FIG. 4 clearly show that $LaB_3O_6$ precipitated as a main crystal phase after the firing though no crystal phase was found before the firing.

The glass B is a crystallized glass containing $B_2O_3$, $La_2O_3$, and ZnO at a ratio of 2.0:1.0:0.5=0.57:0.29:0.14 (in terms of molar ratio). In FIG. 4, line (b) indicates the identification data of the glass B before firing, and line (a) indicates the data after firing in air at 900° C. for two hours. The results in FIG. 4 clearly show that $LaBO_3$ was observed as a main crystal phase after the firing more clearly than before the firing.

The results also show that $LaB_3O_6$ tends to precipitate as a main crystal phase for a relatively high content of boron, as in the glass A, while $LaBO_3$ tends to precipitate as a main crystal phase for a relatively low content of boron, as in the glass B. The measurement by XRD was carried out using a vertical 2-axis goniometer with a copper vessel at a vessel voltage of 40 kV, a vessel current of 40 mA, and a scanning speed of 2.000°/min.

Figure 5:
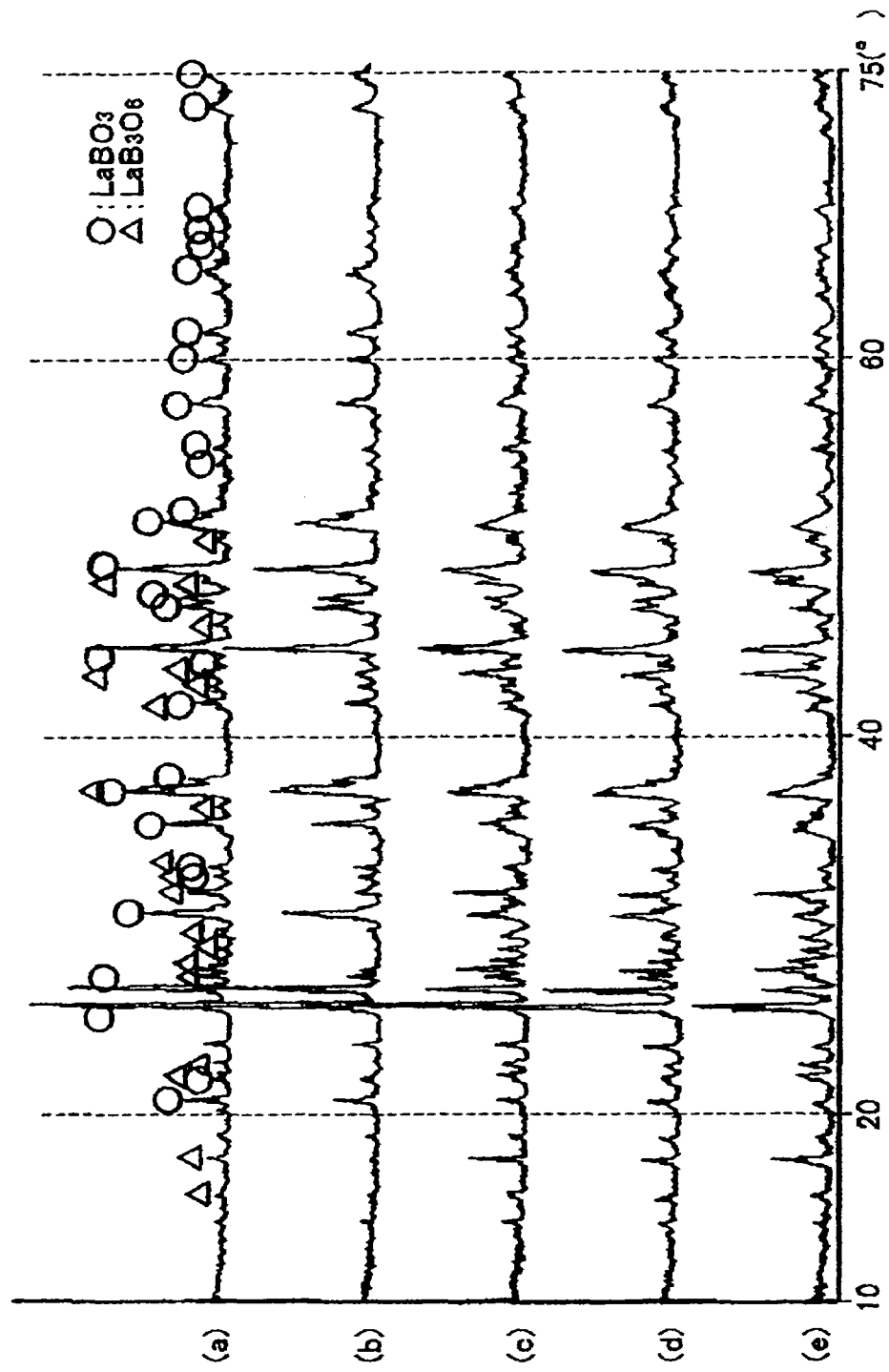
FIG. 5 is a graph showing measurements by XRD after the firing of a ceramic substrate composition according to the present invention.

FIG. 5 shows measurements by XRD for a ceramic substrate composition according to the present invention which contains 20% by weight of the amorphous glass A and 80% by weight of the crystallized glass B. The ceramic substrate composition was fired (a) at 900° C. for two hours, (b) at 875° C. for two hours, (c) at 850° C. for two hours, (d) at 850° C. for 30 minutes, and (e) at 825° C. for two hours, as shown in FIG. 5.

The results in FIG. 5 clearly show that $LaB_3O_6$ and $LaBO_3$ precipitated as main crystal phases at a firing temperature of 825° C. or more. In particular, the main crystal phases were clearly found at firing temperatures above 875° C. While ceramic substrate compositions are generally fired at about 1,200° C., the ceramic substrate composition according to the present invention started to precipitate the crystal phases at about 675° C. Ceramic substrates including $LaB_3O_6$ and $LaBO_3$ crystal phases having satisfactory characteristics were provided at 725° C. or more, particularly 800° C. or more. These results show that $LaB_3O_6$ and $LaBO_3$ crystal phases appear at relatively low temperatures, namely about 725° C. to 900° C., to provide a ceramic substrate having excellent high-frequency characteristics.

(Preparation of Glass)

$La_2O_3$ powder, $B_2O_3$ powder, and ZnO powder were mixed at ratios shown in Tables 1 to 4 below to prepare raw materials for glasses. These mixtures were placed in a platinum crucible, were melted at about 1,200° C., and were rapidly cooled to prepare glasses. These glasses were pulverized to a median size (D50) of 20 μm or less to prepare glass powders as main raw materials.

(Preparation of Ceramic Material)

$La_2O_3$ powder, $B_2O_3$ powder, and ZnO powder were mixed at ratios shown in Tables 1 to 4 below to prepare raw materials for ceramic materials. Pure water or ethanol was then added to the mixtures, which were wet-mixed in a ball mill with zirconia balls or alumina balls for 10 to 30 hours. The resultant mixtures were dried, were calcined at 1,000° C., and were pulverized to a median size of 10 μm or less to prepare ceramic powders (calcined powders).

Analysis by powder X-ray diffraction identified the presence of any one of $LaBO_3$, $La_3BO_6$, and $LaB_3O_6$ crystal phases in the calcined powders containing boron and lanthanum at a ratio of B/La=1/3 to 3/1. The analysis also identified the presence of any one of $NdBO_3$, $Nd_3BO_6$, and $NdB_3O_6$ crystal phases in the calcined powders containing boron and neodymium at a ratio of B/Nd=1/3 to 3/1.

(Preparation of Crystallization Glass)

$La_2O_3$, $B_2O_3$, and ZnO were mixed at ratios shown in Tables 1 to 4 below to prepare raw materials for crystallization glasses. These mixtures were placed in a platinum crucible, were melted at about 1,250° C., and were rapidly cooled to prepare crystallization glasses. These glasses were pulverized to a median size of 20 μm or less to prepare crystallization glass powders.

Analysis by powder X-ray diffraction identified the presence of any one of $LaBO_3$, $La_3BO_6$, and $LaB_3O_6$ crystal phases in the crystallization glass powders represented by $gB_2O_3$-$hLa_2O_3$-$iZnO$ wherein the molar amounts (g, h, and i) fell within the region defined in a ternary composition diagram by Point F (0.4, 0.595, 0.005), Point G (0.4, 0.25, 0.35), Point H (0.52, 0.01, 0.47), Point I (0.9, 0.005, 0.095), and Point J (0.9, 0.09, 0.01). The analysis also identified the presence of any one of $NdBO_3$, $Nd_3BO_6$, and $NdB_3O_6$ crystal phases in the crystallization glass powders represented by $gB_2O_3$-$hNd_2O_3$-$iZnO$ wherein the molar ratios (g, h, and i) fell within the region defined in a ternary composition diagram by Point F (0.4, 0.595, 0.005), Point G (0.4, 0.25, 0.35), Point H (0.52, 0.01, 0.47), Point I (0.9, 0.005, 0.095), and Point J (0.9, 0.09, 0.01).

(Preparation of Ceramic Substrate Composition and Ceramic Substrate)

The glass powders, ceramic powders (calcined powders), and crystallization glass powders thus prepared were weighed out according to weight percentages shown in Tables 1 to 4 and were mixed. Other additives such as $Al_2O_3$ powder, $TiO_2$ powder, and $La_2O_3$ powder were optionally added to the resultant mixtures. Pure water or ethanol was then added to the mixtures, which were wet-mixed in a ball mill with zirconia balls or alumina balls for 10 to 30 hours. After the resultant mixtures were dried, an organic binder for molding was added to the mixtures. These mixed powders were sized and molded into cylinders with a diameter of 15 mm and a height of 7.5 mm using a mold press. These compacts were debinded at 500° C. to 600° C. in air and were fired at firing temperatures shown in Tables 1 to 4. After the firing, the resultant sintered ceramic compacts were polished so that the surfaces thereof became smooth and the top and bottom surfaces thereof became parallel. The sintered ceramic compacts were then washed with an ultrasonic cleaner and were dried to prepare samples for evaluation of dielectric characteristics (Sample No. 1 to 54). The evaluations of the resultant ceramic samples are shown in Tables 1 to 4.

The values of relative dielectric constant ∈r and fQ, which indicates a quality factor at high frequencies, were measured at 10 to 20 GHz using a dielectric resonator with short-circuited terminals. The values of Tf, which indicates resonant frequency characteristics relative to temperature, were the averages of rates of change in resonant frequency at −25° C. to +25° C. and +25° C. to +85° C. The resonant frequency was measured using a resonator with short-circuited terminals by placing the ceramic samples and a jig in a constant-temperature bath at a predetermined temperature. The flexural strength was measured by a three-point bending test. In this test, a ceramic sample having a width of about 10 mm, a length of about 60 mm, and a thickness of about 1 mm was placed on two fulcra 30 mm apart to determine the flexural strength from the strength at the time when the sample fractured and the dimensions of the sample according to JIS R1601:1981. For the samples prepared with the ceramic powders including a $LaBO_3$, $La_3BO_6$, or $LaB_3O_6$ crystal phase, any one of $LaBO_3$, $La_3BO_6$, and $LaB_3O_6$ crystal phases was also observed in the sintered ceramic compacts. For the samples prepared with the ceramic powders including a $NdBO_3$, $Nd_3BO_6$, or $NdB_3O_6$ crystal phase, on the other hand, any one of $NdBO_3$, $Nd_3BO_6$, and $NdB_3O_6$ crystal phases was observed in the sintered ceramic compacts.

TABLE 1

| No. | wt. % | Glass La$_2$O$_3$ | B$_2$O$_3$ | ZnO | wt. % | Additive La$_2$O$_3$ | B$_2$O$_3$ | ZnO | Type/material | Al$_2$O$_3$/ TiO$_2$ | Firing temperature (°C.) | Porosity (%) | εr | fQ (GHz) | T$_f$ (ppm/°C.) | Flexural strength (MPa) |
|---|---|---|---|---|---|---|---|---|---|---|---|---|---|---|---|---|
| 1  | 20 | 1 | 3 | 0.5 | 80 | 1 | 2 | 0 | Calcined powder | 0 | 925 | 0.9 | 12.4 | 26,000 | −47 | 175 |
| 2  | 50 | 1 | 3 | 0.5 | 50 | 1 | 2 | 0 | Calcined powder | 0 | 900 | 0.5 | 9.0  | 37,000 | −45 | 180 |
| 3  | 80 | 1 | 3 | 0.5 | 20 | 1 | 2 | 0 | Calcined powder | 0 | 900 | 0.1 | 8.0  | 45,000 | −42 | 190 |
| 4  | 85 | 1 | 3 | 0.5 | 15 | 1 | 2 | 0 | Calcined powder | 0 | 850 | 1.9 | 7.4  | 29,000 | −55 | 200 |
| 5  | 8  | 1 | 2 | 0.5 | 92 | 1 | 2 | 0 | Calcined powder | 0 | 950 | 5.1 | 12.5 | 20,000 | −51 | 150 |
| 6  | 20 | 1 | 2 | 0.5 | 80 | 1 | 2 | 0 | Calcined powder | 0 | 900 | 1.7 | 12.9 | 27,000 | −48 | 140 |
| 7  | 50 | 1 | 2 | 0.5 | 50 | 1 | 2 | 0 | Calcined powder | 0 | 875 | 0.7 | 10.0 | 30,000 | −47 | 140 |
| 8  | 80 | 1 | 2 | 0.5 | 20 | 1 | 2 | 0 | Calcined powder | 0 | 875 | 0.4 | 9.5  | 33,000 | −46 | 150 |
| 9  | 20 | 1 | 2 | 1   | 80 | 1 | 2 | 0 | Calcined powder | 0 | 950 | 0.5 | 12.1 | 26,000 | −47 | 150 |
| 10 | 50 | 1 | 2 | 1   | 50 | 1 | 2 | 0 | Calcined powder | 0 | 900 | 0.6 | 11   | 29,000 | −40 | 160 |
| 11 | 80 | 1 | 2 | 1   | 20 | 1 | 2 | 0 | Calcined powder | 0 | 875 | 0.5 | 10   | 34,000 | −45 | 150 |
| 12 | 20 | 1 | 4 | 2   | 80 | 1 | 2 | 0 | Calcined powder | 0 | 875 | 0.6 | 10.5 | 25,000 | −45 | 160 |
| 13 | 50 | 1 | 4 | 2   | 50 | 1 | 2 | 0 | Calcined powder | 0 | 900 | 0.5 | 10   | 39,000 | −40 | 170 |
| 14 | 80 | 1 | 4 | 2   | 20 | 1 | 2 | 0 | Calcined powder | 0 | 850 | 0.1 | 9.8  | 48,000 | −41 | 180 |
| 15 | 20 | 1 | 2 | 0.1 | 80 | 1 | 2 | 0 | Calcined powder | 0 | 925 | 0.2 | 9.9  | 39,000 | −40 | 190 |
| 16 | 50 | 1 | 2 | 0.1 | 50 | 1 | 2 | 0 | Calcined powder | 0 | 900 | 0.1 | 9.0  | 46,000 | −41 | 200 |
| 17 | 80 | 1 | 2 | 0.1 | 20 | 1 | 2 | 0 | Calcined powder | 0 | 850 | 0.1 | 7.4  | 49,000 | −35 | 210 |

TABLE 2

| No. | wt. % | Glass La$_2$O$_3$ | B$_2$O$_3$ | ZnO | wt. % | Additive La$_2$O$_3$ | B$_2$O$_3$ | ZnO | Type/material | Al$_2$O$_3$/ TiO$_2$ | Firing temperature (°C.) | Porosity (%) | εr | fQ (GHz) | T$_f$ (ppm/°C.) | Flexural strength (MPa) |
|---|---|---|---|---|---|---|---|---|---|---|---|---|---|---|---|---|
| 18 | 50 | 1   | 0   | 1   | 50 | 1 | 2 | 0   | Calcined powder | 0 | 1,050 | 0.5 | 13.1 | 6,200  | −55 | 160 |
| 19 | 50 | 0   | 1   | 1   | 50 | 1 | 2 | 0   | Calcined powder | 0 | 825   | 1   | 13   | 12,000 | −61 | 180 |
| 20 | 20 | 1   | 3   | 0.5 | 80 | 1 | 3 | 0   | Calcined powder | 0 | 925   | 0.5 | 10.5 | 40,000 | −40 | 200 |
| 21 | 50 | 1   | 3   | 0.5 | 50 | 1 | 4 | 0   | Calcined powder | 0 | 800   | 3.5 | 7.1  | 18,000 | −49 | 145 |
| 22 | 50 | 1   | 3   | 0.5 | 50 | 1 | 1 | 1   | Calcined powder | 0 | 900   | 0.4 | 10   | 31,000 | −41 | 170 |
| 23 | 20 | 1   | 3   | 0.5 | 80 | 2 | 1 | 0   | Calcined powder | 0 | 950   | 0.5 | 11.5 | 26,000 | −41 | 180 |
| 24 | 50 | 1   | 3   | 0.5 | 50 | 2 | 1 | 0   | Calcined powder | 0 | 900   | 0.9 | 12.5 | 30,000 | −40 | 200 |
| 25 | 50 | 1   | 3   | 0.5 | 50 | 3 | 1 | 0   | Calcined powder | 0 | 950   | 0.5 | 11   | 31,000 | −41 | 150 |
| 26 | 50 | 1   | 3   | 0.5 | 50 | 1 | 3 | 0.5 | Calcined powder | 0 | 850   | 0.3 | 12.0 | 34,000 | −45 | 150 |
| 27 | 50 | 1   | 3   | 0.5 | 50 | 1 | 3 | 0.5 | Calcined powder | 50(TiO$_2$) | 875 | 0.1 | 15.6 | 37,000 | +49 | 170 |
| 28 | 50 | 1   | 3   | 0.5 | 50 | 1 | 3 | 0.5 | Calcined powder | 30(TiO$_2$) | 900 | 0.2 | 14.1 | 31,000 | +32 | 190 |
| 29 | 50 | 1   | 3   | 0.5 | 50 | 1 | 3 | 0.5 | Calcined powder | 10(TiO$_2$) | 900 | 0.1 | 10.1 | 35,000 | +8  | 180 |
| 30 | 50 | 1   | 3   | 0.5 | 50 | 1 | 3 | 0.5 | Calcined powder | 5(TiO$_2$)  | 875 | 0.2 | 9.5  | 31,000 | −29 | 190 |
| 31 | 50 | 1   | 3   | 0.5 | 50 | 1 | 3 | 0.5 | Calcined powder | 30(Al$_2$O$_3$) | 925 | 0.3 | 8.0 | 26,000 | −39 | 260 |
| 32 | 50 | 1   | 3   | 0.5 | 50 | 1 | 3 | 0.5 | Calcined powder | 5(Al$_2$O$_3$)  | 925 | 0.2 | 7.9 | 31,000 | −32 | 280 |
| 33 | 50 | 1   | 3   | 0.5 | 50 | 1 | 3 | 0.5 | Calcined powder | 20(Al$_2$O$_3$) 20(TiO$_2$) | 900 | 0.2 | 9.8 | 33,000 | −25 | 220 |
| 34 | 20 | 0.9 | 8.5 | 0.5 | 80 | 1 | 1 | 0   | Calcined powder | 0 | 925 | 0.1 | 7.5 | 51,000 | −39 | 200 |
| 35 | 90 | 1   | 3   | 0.5 | 10 | 1 | 2 | 0.5 | Crystallization glass | 0 | 850 | 0.1 | 7.2 | 55,000 | −42 | 180 |
| 36 | 80 | 1   | 3   | 0.5 | 20 | 1 | 2 | 0.5 | Crystallization glass | 0 | 875 | 0.1 | 7.5 | 77,000 | −40 | 190 |

TABLE 3

| No. | wt. % | Glass La$_2$O$_3$ | B$_2$O$_3$ | ZnO | wt. % | Additive La$_2$O$_3$ | B$_2$O$_3$ | ZnO | Type/material | Al$_2$O$_3$/ TiO$_2$ | Firing temperature (°C.) | Porosity (%) | εr | fQ (GHz) | T$_f$ (ppm/°C.) | Flexural strength (MPa) |
|---|---|---|---|---|---|---|---|---|---|---|---|---|---|---|---|---|
| 37 | 70 | 1 | 3 | 0.5 | 30 | 1 | 2 | 0.5 | Crystallization glass | 0 | 875 | 0   | 7.7 | 69,000 | −41 | 200 |
| 38 | 60 | 1 | 3 | 0.5 | 40 | 1 | 2 | 0.5 | Crystallization glass | 0 | 900 | 0.1 | 7.9 | 72,000 | −42 | 210 |
| 39 | 50 | 1 | 3 | 0.5 | 50 | 1 | 2 | 0.5 | Crystallization glass | 0 | 900 | 0   | 8.0 | 69,000 | −41 | 200 |
| 40 | 40 | 1 | 3 | 0.5 | 60 | 1 | 2 | 0.5 | Crystallization glass | 0 | 900 | 0   | 7.9 | 71,000 | −43 | 180 |

TABLE 3-continued

| | wt. | Glass | | | wt. | Additive | | | | $Al_2O_3/$ | Firing temperature | Porosity | Characteristics | | | Flexural |
|---|---|---|---|---|---|---|---|---|---|---|---|---|---|---|---|---|
| No. | % | $La_2O_3$ | $B_2O_3$ | ZnO | % | $La_2O_3$ | $B_2O_3$ | ZnO | Type/material | $TiO_2$ | (° C.) | (%) | εr | fQ (GHz) | $T_f$ (ppm/° C.) | strength (MPa) |
| 41 | 80 | 1 | 3 | 0.5 | 20 | 1 | 2 | 0.5 | Crystallization glass | 10($TiO_2$) | 850 | 0 | 7.8 | 56,000 | +3 | 190 |
| 42 | 50 | 1 | 3 | 0.5 | 50 | 1 | 2 | 0.5 | Crystallization glass | 10($TiO_2$) | 875 | 0 | 8.0 | 59,000 | −1 | 180 |
| 43 | 50 | 1 | 3 | 0.5 | 50 | 1 | 2 | 0.5 | Crystallization glass | 5($Al_2O_3$) | 900 | 0 | 7.7 | 39,000 | −40 | 220 |
| 44 | 90 | 1 | 4 | 0.5 | 10 | 1 | 0 | 0 | $La_2O_3$ | 0 | 900 | 0 | 8.1 | 54,000 | −35 | 190 |
| 45 | 70 | 1 | 4 | 0.5 | 30 | 1 | 0 | 0 | $La_2O_3$ | 0 | 900 | 0.2 | 7.9 | 57,000 | −39 | 200 |
| 46 | 50 | 1 | 4 | 0.5 | 50 | 1 | 0 | 0 | $La_2O_3$ | 0 | 950 | 1 | 7.2 | 21,000 | −48 | 180 |

TABLE 4

| | wt. | Glass | | | wt. | Additive | | | | $Al_2O_3/$ | Firing temperature | Porosity | Characteristics | | | Flexural |
|---|---|---|---|---|---|---|---|---|---|---|---|---|---|---|---|---|
| No. | % | $Nb_2O_3$ | $B_2O_3$ | ZnO | % | $Nb_2O_3$ | $B_2O_3$ | ZnO | Type/material | $TiO_2$ | (° C.) | (%) | εr | fQ (GHz) | $T_f$ (ppm/° C.) | strength (MPa) |
| 47 | 20 | 1 | 3 | 0.5 | 80 | 1 | 2 | 0 | Calcined powder | 0 | 950 | 0.9 | 13.6 | 25,000 | −40 | 165 |
| 48 | 50 | 1 | 3 | 0.5 | 50 | 1 | 2 | 0 | Calcined powder | 0 | 925 | 0.3 | 9.5 | 37,000 | −45 | 170 |
| 49 | 80 | 1 | 3 | 0.5 | 20 | 1 | 2 | 0 | Calcined powder | 0 | 900 | 0.1 | 9.0 | 30,000 | −42 | 150 |
| 50 | 85 | 1 | 3 | 0.5 | 15 | 1 | 2 | 0 | Calcined powder | 0 | 850 | 1.9 | 8.4 | 15,000 | −53 | 180 |
| 51 | 50 | 1 | 3 | 0.5 | 50 | 1 | 2 | 0 | Crystallization glass | 0 | 900 | 0.3 | 9.6 | 45,000 | −40 | 160 |
| 52 | 50 | 1 | 3 | 0.5 | 50 | 1 | 2 | 0 | Crystallization glass | 10($TiO_2$) | 900 | 0.3 | 10.6 | 29,000 | +10 | 160 |
| 53 | 50 | 1 | 3 | 0.5 | 50 | 1 | 2 | 0 | Crystallization glass | 20($TiO_2$) | 900 | 0.2 | 11.5 | 27,000 | +23 | 150 |
| 54 | 50 | 1 | 3 | 0.5 | 50 | 1 | 2 | 0 | Crystallization glass | 10($Al_2O_3$) | 925 | 0.1 | 8.5 | 25,000 | −43 | 200 |

As shown above, the ceramic substrate compositions could be fired at 1,000° C. or less, at which a low-melting metal such as silver or copper can be co-fired, when the ceramic substrate compositions contained the glasses represented by the general formula A: $aB_2O_3$-$bRe_2O_3$-$cZnO$ (wherein Re is lanthanum or neodymium; and a+b+c=1); and when the molar amounts (a, b, and c) fell within the region defined by Point A (0.4, 0.595, 0.005), Point B (0.4, 0.25, 0.35), Point C (0.52, 0.01, 0.47), Point D (0.9, 0.005, 0.095), and Point E (0.9, 0.09, 0.01) in the ternary composition diagram shown in FIG. 1. Furthermore, sintered ceramic compacts could be achieved which had low dielectric loss at high frequencies, namely an fQ of 15,000 GHz or more, particularly 25,000 GHz or more.

In addition, the flexural strength of the resultant sintered ceramic compacts could be significantly improved when the ceramic substrate compositions contained $Al_2O_3$ in an amount of 50% or less by weight of the total amount. On the other hand, the relative dielectric constant of the resultant sintered ceramic compacts could be increased when the ceramic substrate compositions contained $TiO_2$ in an amount of 50% or less by weight of the total amount. Furthermore, the balance between the flexural strength and relative dielectric constant could be suitably controlled by adjusting the contents of these ceramic materials.

In addition, the firing temperatures for the ceramic substrate compositions could be decreased and the fQ of the resultant sintered ceramic compacts could be increased to, for example, 30,000 GHz or more when the ceramic substrate compositions contained at least one mixed oxide ceramic material selected from the group consisting of $ReBO_3$, $Re_3BO_6$, and $ReB_3O_6$ (wherein Re is lanthanum or neodymium) in an amount of 20% to 90% by weight of the total amount of the glass represented by the general formula A. The fQ of the sintered ceramic compacts could be further increased when the ceramic substrate compositions also contained ZnO. Furthermore, sintered ceramic compacts could be achieved which had a flexural strength of 150 MPa or more with rates of change in resonant frequency relative to temperature, Tf, within ±50 ppm/° C.

In particular, sintered ceramic compacts having a porosity of 0.3% or less and an fQ of 50,000 GHz or more could be achieved. This is because the ceramic substrate compositions contained a crystallization glass represented by $gB_2O_3$-$hRe_2O_3$-$iZnO$ (wherein Re is lanthanum or neodymium; and g+h+i=1) in an amount of 20% to 90% by weight of the total amount of the glass represented by the general formula A, and the molar amounts (g, h, and i) fell within the region defined in a ternary composition diagram by Point F (0.4, 0.595, 0.005), Point G (0.4, 0.25, 0.35), Point H (0.52, 0.01, 0.47), Point I (0.9, 0.005, 0.095), and Point J (0.9, 0.09, 0.01). The crystallization glass could precipitate at least one mixed oxide selected from the group consisting of $ReBO_3$, $Re_3BO_6$, and $ReB_3O_6$ (wherein Re is lanthanum or neodymium). Furthermore, sintered ceramic compacts could be achieved which had a flexural strength of 150 MPa or more with rates of change in resonant frequency relative to temperature, Tf, within ±50 ppm/° C.

In addition, the sintered ceramic compacts could have an fQ of 50,000 GHz or more when the ceramic substrate compositions contained $La_2O_3$ such that the total compositions of the sintered ceramic compacts fell within the region in the ternary composition diagram shown in FIG. 1. Furthermore, sintered ceramic compacts could be achieved which had a flexural strength of 150 MPa or more with rates of change in resonant frequency relative to temperature, Tf, within ±50 ppm/° C.

The invention claimed is:

1. A ceramic substrate composition comprising a glass represented by $aB_2O_3$-$bRe_2O_3$-$cZnO$ in which Re is a rare earth element which is at least one element selected from the group consisting of lanthanum and neodymium and the molar amounts a+b+c=1; and wherein the molar amounts (a, b, and c) fall within a region defined in a ternary composition diagram by Point A (0.4, 0.595, 0.005), Point B (0.4, 0.25, 0.35), Point C (0.52, 0.01, 0.47), Point D (0.9, 0.005, 0.095), and Point E (0.9, 0.09, 0.01) or on the lines connection the Points, and further comprising at least one of (a) at least one oxide selected from the group consisting of aluminum oxide and titanium oxide in an amount of 50% or less by weight of the total amount, (b) a mixed oxide ceramic material including at least one crystal phase selected from the group consisting of $ReBO_3$, $Re_3BO_6$, $Re(B_2O_3)_3$ and $ReB_3O_6$, (c) a crystallization glass that can precipitate at least one crystal phase selected from the group consisting of $ReBO_3$, $Re_3BO_6$, $Re(B_2O_3)_3$ and $ReB_3O_6$ and (d) a crystallization glass that can precipitate at least one crystal phase selected from the group consisting of $ReBO_3$, $Re_3BO_6$, $Re(B_2O_3)_3$ and $ReB_3O_6$ and, in addition to the rare earth oxide of the glass, a rare earth oxide comprising $Re_2O_3$.

2. The ceramic substrate composition according to claim 1, wherein the mixed oxide ceramic material is 20% to 90% by weight of the total amount of the glass and the mixed oxide ceramic material, and is calcined $dB_2O_3$-$eRe_2O_3$ in which the molar ratio d/e=1/3 to 3/1 and optionally further contains ZnO; and wherein the crystallization glass is 20% to 90% by weight of the total amount of the glass and the crystallization glass and is represented by $gB_2O_3$-$hRe_2O_3$-$iZnO$ in which g+h+i=1 and the molar amounts g, h, and i fall within a region defined in a ternary composition diagram by Point F (0.4, 0.595, 0.005), Point G (0.4, 0.25, 0.35), Point H (0.52, 0.01, 0.47), Point I (0.9, 0.005, 0.095), and Point J (0.9, 0.09, 0.01) or on the lines connected those Points; and wherein the total molar amounts of $B_2O_3$, $Re_2O_3$ and ZnO in the composition are such that they fall within a region defined in a ternary composition diagram by Points A through E or on the lines connected those Points.

3. A ceramic substrate composition comprising a glass represented by $aB_2O_3$-$bRe_2O_3$-$cZnO$ in which Re is a rare earth element and the molar amounts a+b+c=1; and wherein the molar amounts (a, b, and c) fall within a region defined in a ternary composition diagram by Point A (0.4, 0.595, 0.005), Point B (0.4, 0.25, 0.35), Point C (0.52, 0.01, 0.47), Point D (0.9, 0.005, 0.095), and Point E (0.9, 0.09, 0.01) or on the lines connection the Points, and further comprising at least one oxide selected from the group consisting of aluminum oxide and titanium oxide in an amount of 50% or less by weight of the total amount.

4. The ceramic substrate composition according to claim 3, further comprising, in addition to the rare earth oxide of the glass, a rare earth oxide comprising $Re_2O_3$.

5. A method for producing a ceramic substrate according to claim 1, comprising providing a predetermined shaped ceramic substrate composition comprising a glass represented by $aB_2O_3$-$bRe_2O_3$-$cZnO$ in which Re is a rare earth element, a+b+c=1, and the molar amounts a, b, and c fall within a region defined in a ternary composition diagram by Point A (0.4, 0.595, 0.005), Point B (0.4, 0.25, 0.35), Point C (0.52, 0.01, 0.47), Point D (0.9, 0.005, 0.095), and Point E (0.9, 0.09, 0.01) or on the lines connecting those Points; and firing the shaped ceramic substrate composition.

6. The method for producing a ceramic substrate according to claim 5, wherein the shaped product is fired at 1,000° C. or less.

\* \* \* \* \*

UNITED STATES PATENT AND TRADEMARK OFFICE
CERTIFICATE OF CORRECTION

PATENT NO. : 7,482,292 B2  Page 1 of 1
APPLICATION NO. : 11/955068
DATED : January 27, 2009
INVENTOR(S) : Takahiro Takada et al.

It is certified that error appears in the above-identified patent and that said Letters Patent is hereby corrected as shown below:

Please correct the title of the application on the cover page, Item (54), of the Letters Patent as indicated below:

"COMPOSITION FOR CERAMIC SUBSTRATE, CERAMIC SUBSTRATE, METHOD FOR PRODUCING CERAMIC SUBSTRATE", it should read -- COMPOSITION FOR CERAMIC SUBSTRATE, CERAMIC SUBSTRATE, METHOD FOR PRODUCING CERAMIC SUBSTRATE, AND GLASS COMPOSITION --, On the Title page Item (75) please correct the 2nd Inventors last name on the cover page, Item (75) Inventors:, of the Letters Patent as indicated below:

"Hirofumi Yamamoto" should read -- Hirobumi Yamamoto --

Signed and Sealed this

Seventeenth Day of March, 2009

JOHN DOLL
*Acting Director of the United States Patent and Trademark Office*

UNITED STATES PATENT AND TRADEMARK OFFICE
CERTIFICATE OF CORRECTION

PATENT NO. : 7,482,292 B2
APPLICATION NO. : 11/955068
DATED : January 27, 2009
INVENTOR(S) : Takahiro Takada et al.

It is certified that error appears in the above-identified patent and that said Letters Patent is hereby corrected as shown below:

Please correct the title of the application on the cover page, Item (54) and Column 1, lines 1-3, of the Letters Patent as indicated below:

"COMPOSITION FOR CERAMIC SUBSTRATE, CERAMIC SUBSTRATE, METHOD FOR PRODUCING CERAMIC SUBSTRATE", it should read -- COMPOSITION FOR CERAMIC SUBSTRATE, CERAMIC SUBSTRATE, METHOD FOR PRODUCING CERAMIC SUBSTRATE, AND GLASS COMPOSITION --, On the Title page Item (75) please correct the 2nd Inventors last name on the cover page, Item (75) Inventors:, of the Letters Patent as indicated below:

"Hirofumi Yamamoto" should read -- Hirobumi Yamamoto --

This certificate supersedes the Certificate of Correction issued March 17, 2009.

Signed and Sealed this

Seventh Day of April, 2009

JOHN DOLL
*Acting Director of the United States Patent and Trademark Office*